United States Patent
Reis et al.

(10) Patent No.: US 7,365,988 B2
(45) Date of Patent: Apr. 29, 2008

(54) CYCLING LED HEAT SPREADER

(75) Inventors: Bradley E. Reis, Westlake, OH (US);
Martin David Smalc, Parma, OH (US);
Brian J. Laser, Munroe Falls, OH
(US); Gary Stephen Kostyak,
Brunswick, OH (US); **Prathib
Skandakumaran**, Cleveland, OH (US);
Matthew G. Getz, Medina, OH (US);
Michael Frastaci, Parma, OH (US)

(73) Assignee: GrafTech International Holdings Inc.,
Parma, OH (US)

( * ) Notice: Subject to any disclaimer, the term of this patent is extended or adjusted under 35 U.S.C. 154(b) by 0 days.

(21) Appl. No.: 11/466,449

(22) Filed: Aug. 22, 2006

(65) Prior Publication Data

US 2007/0103875 A1    May 10, 2007

Related U.S. Application Data (63) Continuation-in-part of application No. 11/339,338, filed on Jan. 25, 2006, now Pat. No. 7,303,005, which is a continuation-in-part of application No. 11/267,933, filed on Nov. 4, 2005.

(51) Int. Cl.
*H05K 7/20* (2006.01)

(52) U.S. Cl. .............. 361/719; 361/704; 361/707; 361/708; 257/706

(58) Field of Classification Search ............ None
See application file for complete search history.

(56) References Cited

U.S. PATENT DOCUMENTS

| | | | |
|---|---|---|---|
| 3,404,061 A | 10/1968 | Shane et al. | 161/125 |
| 3,678,995 A | 7/1972 | Collard | 165/185 |
| 4,234,638 A | 11/1980 | Yamazoe et al. | 428/133 |
| 4,782,893 A | 11/1988 | Thomas | 165/185 |
| 4,812,792 A | 3/1989 | Leibowitz | 333/238 |
| 4,878,152 A | 10/1989 | Sauzade et al. | 361/386 |
| 4,895,713 A | 1/1990 | Greinke et al. | 423/448 |
| 4,961,991 A | 10/1990 | Howard | 428/246 |
| 5,192,605 A | 3/1993 | Mercuri et al. | 428/224 |
| 5,224,030 A | 6/1993 | Banks et al. | 361/386 |
| 5,255,738 A | 10/1993 | Przilas | 165/185 |
| 5,287,248 A | 2/1994 | Montesano | 361/708 |
| 5,316,080 A | 5/1994 | Banks et al. | 165/185 |
| 5,366,688 A | 11/1994 | Terpstra et al. | 419/36 |
| 5,509,993 A | 4/1996 | Hirschvogel | 156/326 |
| 5,542,471 A | 8/1996 | Dickinson | 165/170 |
| 5,660,917 A | 8/1997 | Fujimori et al. | 428/195 |
| 5,902,762 A | 5/1999 | Mercuri et al. | 501/99 |

(Continued)

OTHER PUBLICATIONS

PCT/US02/39749 Published Jun. 26, 2003, WO 03/051772.

(Continued)

*Primary Examiner*—Boris Chervinsky
(74) *Attorney, Agent, or Firm*—James R. Cartiglia; Waddey & Patterson, PC (57) ABSTRACT

A graphite heat spreader is provided for use with a flash LED light source for a camera of a handheld device such as a cell phone. Dramatically reduced operating temperatures are provided at substantially increased power levels thus providing both improved lighting and improved operating life of the electronic components.

13 Claims, 7 Drawing Sheets

U.S. PATENT DOCUMENTS

| | | | | |
|---|---|---|---|---|
| 5,944,097 | A | 8/1999 | Gungor et al. | 165/185 |
| 5,958,572 | A | 9/1999 | Schmidt et al. | 428/320 |
| 6,027,807 | A | 2/2000 | Inoue et al. | 428/408 |
| 6,060,166 | A | 5/2000 | Hoover et al. | 428/408 |
| 6,075,701 | A | 6/2000 | Ali et al. | 361/704 |
| 6,131,651 | A | 10/2000 | Richey, III | 165/185 |
| 6,141,216 | A | 10/2000 | Holung et al. | 361/687 |
| 6,208,513 | B1 | 3/2001 | Fitch et al. | 361/704 |
| 6,503,626 | B1 | 1/2003 | Norley et al. | 428/408 |
| 6,538,892 | B2 | 3/2003 | Smalc | 361/710 |
| 6,555,223 | B2 | 4/2003 | Kubo | 428/408 |
| 6,673,289 | B2 | 1/2004 | Reynolds, III et al. | 264/115 |
| 6,706,400 | B2 | 3/2004 | Mercuri et al. | 428/408 |
| 6,749,010 | B2 | 6/2004 | Getz, Jr. et al. | 165/80.3 |
| 6,758,263 | B2 | 7/2004 | Krassowski et al. | 165/185 |
| 6,771,502 | B2 | 8/2004 | Getz, Jr. et al. | 361/703 |
| 6,886,249 | B2 | 5/2005 | Smalc | 29/890.03 |
| 6,896,393 | B2 * | 5/2005 | Makuta | 362/294 |
| 6,930,885 | B2 | 8/2005 | Barcley | 361/719 |
| 7,027,304 | B2 * | 4/2006 | Aisenbrey | 361/704 |
| 7,095,053 | B2 * | 8/2006 | Mazzochette et al. | 257/81 |
| 7,098,483 | B2 * | 8/2006 | Mazzochette et al. | 257/81 |
| 7,170,751 | B2 * | 1/2007 | Mayer | 361/719 |
| 7,176,502 | B2 * | 2/2007 | Mazzochette et al. | 257/99 |
| 2003/0116312 | A1 | 6/2003 | Krassowski et al. | |
| 2006/0131010 | A1 * | 6/2006 | Hsu et al. | 165/185 |
| 2006/0214177 | A1 * | 9/2006 | Jones | 257/99 |

OTHER PUBLICATIONS

PCT/US02/39749 Published Jun. 26, 2003, WO 03/051772.
U.S. Patent Application Publication No. 2002/0157819, Oct. 31, 2002.
U.S Patent Application Publication No. 2003/0019104, Jan. 30, 2003.
European Patent Application No. 95104171.4, Publication No. 0673900, filed Mar. 22, 1995.
Exhibit "A" - webpage for Radian Heatsinks-Standard Heatsink Products.
Exhibit "B" - webpage for Arkua Cooler; Special Design for Intel P4 Socket 423-478; Intel PIII PGA 3710; AMD Socket 462.

* cited by examiner

| Power of LED (W) | Max Tj (deg C) |
|---|---|
| 0.5 | 64.2 |
| 1.0 | 100.6 |
| 1.5 | 133.1 |
| 2.0 | 163.6 |
| 2.5 | 193.0 |
| 3.0 | 224.8 |

CYCLING LED HEAT SPREADER

This invention is a continuation-in-part of U.S. patent application Ser. No. 11/339,338 filed Jan. 25, 2006 now U.S. Pat. No. 7,303,005, entitled "Heat Spreaders With Vias", by Reis et al., which is a continuation-in-part of co-pending U.S. patent application Ser. No. 11/267,933 filed Nov. 4, 2005, entitled "Heat Spreading Circuit Assembly", by Reis et al., the details of each of which are incorporated herein by reference.

TECHNICAL FIELD

The present invention relates to handheld devices including a light emitting diode (LED) light source, such as a handheld cell phone or personal digital assistant which includes an LED for use, e.g., as flash for a camera. Thus, the LED light source must cycle on and off. The invention provides a heat spreader for the cycling light source that reduces operating temperatures of the light source, enables a faster cycling time, enables a longer duration while on, enables higher brightness, and/or enables a higher reliability and brightness of the LED source over its lifetime.

BACKGROUND OF THE INVENTION

Handheld devices such as cell phones, personal digital assistants, and the like, commonly incorporate cameras, and typically include a cycling light source, such as an LED which acts as a flash for the camera.

The LED will be connected electrically to a circuit assembly. The circuit assembly may be of the type commonly referred to in the industry as a "printed circuit board" or of the type commonly referred to in the industry as a "flex circuit". In either case, an electrical circuit is provided on a substrate of dielectric material.

In the case of a flex circuit, an electrical circuit, such as a copper circuit, is provided on the surface of a polymer material, such as polyimide or polyester, which functions as the dielectric layer. As the name suggests, these substrate materials are flexible and can even be provided as rolls of material. Such flex circuits may also be further supported by a stiffener, which can be a metal, a plastic, or other material, such as a pad of glass fiber laminate material, generally known as FR4 material, which provides more structural rigidity to the assembly so as to aid in the support and alignment of the LED light source within the handheld device.

In the case of printed circuit boards, those are conventionally manufactured from dielectric materials such as glass fiber laminates (sometimes known as FR4 boards), polytetrafluoroethylene, and like materials. On one of the surfaces of such board, or between layers of dielectric materials, are circuits, usually formed of copper. The circuits are commonly formed by photolithographic methods, sputtering, screen printing or the like (for circuits disposed between layers, the circuit is applied to the dielectric material before formation of the laminate). The light source can be disposed on the surface of the boards, in contact with the circuits on the surface. When a "flash" light source is employed, the light source generates substantial amounts of heat in a short period of time, that must be dissipated for the device to operate reliably and to its intended performance level. Indeed, for LED light sources, it is well-known that the cooler the junction temperature of the LED, the higher the instantaneous brightness of the LED is, and the decay of luminosity output slows (in other words, when the junction temperature of an LED is elevated, the LED exhibits lower instantaneous brightness and faster decay of luminosity over extended periods of time).

Cycling light sources for the cameras of cell phones and other small handheld devices generate a significant amount of heat in a relatively short period of time (on the order of less than 1 second, more typically less than 500 millisecond (ms)), which provides a limiting factor in the operation of the camera and flash. Significant delays can be encountered between flashes (the amount of time between consecutive flashes is referred to as the recovery time for the light source), due to overheating issues. Indeed, recovery times of greater than 5 seconds are not uncommon, where recovery times as short as possible are the goal of the industry. Furthermore, in a continuous lighting, or so called "torch" mode of operation, illumination levels are again limited due to overheating considerations. The possible solutions to these overheating issues are constrained by the very limited space availability within the handheld device.

In the broader field of larger electronic devices, various heat spreader technologies have been developed. So called "thermal boards" are being developed where a layer of a heat spreading material such as copper or aluminum and alloys thereof is laminated with the dielectric material, on the surface opposite or in layers opposing that of the circuit and heat-generating components, to act as a heat spreader for the heat generated from the electronic components. It is important that the heat spreader be located such that at least one layer of dielectric material separates the heat spreader from the circuit(s), since the heat spreader materials are typically electrically conductive, and would interfere with the operation of the circuits if they were in contact.

There are several commercially available "thermal boards," sometimes called metal core printed circuit boards (MCPCB), such as Insulated Metal Substrate™ thermal boards from The Bergquist Company, T-Clad™ thermal boards from Thermagon, HITT Plate boards from Denka, and Anotherm™ boards from TT Electronics. These thermal boards utilize thermally conductive dielectric layers, either through filling the dielectric layer with thermally conductive particles as in the case of the first three, or as in the case of the Anotherm solution, through a thin anodization layer on top of the aluminum heat spreader layer. The use of thermally conductive particles can be expensive, however, and the subsequent layer must be thick enough to ensure it is pin-hole free, adding to thermal resistance in the design. Additional limitations of this approach arise from the lack of flexibility to fabricate bent or non-planar circuit structures, and the fact that the dielectric material covers the entire surface of the heat spreader layer. The use of anodization as the dielectric layer attempts to overcome some of these issues, but forces the use of aluminum as its heat spreader layer, since copper cannot be anodized. Since the thermal conductivity of aluminum is significantly less than that of copper, this can be a thermal disadvantage. All of the foregoing approaches, however, can suffer soldering difficulties, since the same heat dissipation properties that are useful during the operation of the printed circuit board and components, inhibit an assembly process that requires point sources of heat for soldering (such as hot bar bonding, for example).

To overcome some, but not all of these issues, traditional printed circuit boards can be married to a separate metal heat spreader layer in a separate process. In this arrangement, the printed circuit board can be designed with thermal vias (typically drilled holes that are plated with copper) to conduct heat better through the unfilled dielectric layer of the printed circuit board, but these may only be used in applications where electrical isolation from component to component is not required.

Moreover, traditional heat spreading materials like copper or aluminum also add significant weight to the board, which is undesirable, and the coefficient of thermal expansion (CTE) of these materials may not closely match that of the glass fiber laminate, leading to physical stress on the printed circuit board with the application of heat and, potentially, delamination or cracking.

Additionally, since the heat spreader layer on these boards is comprised of an isotropic, thin (relative to its length and width) metal material, heat tends to flow through the thickness of the heat spreader readily, and resulting hot-spots can occur in the location directly opposite the heat source.

As noted, another type of circuit assembly, referred to in the industry as a "flex circuit," provides similar heat management problems. Flex circuits are formed by providing a circuit, such as a copper circuit as described above, on the surface of a polymer material, such as a polyimide or polyester, which functions as the dielectric layer. As the name suggests, these circuit materials are flexible and can even be provided as rolls of circuit materials that can later be married to a heat spreader layer like copper or aluminum. While very thin, the dielectric layer in flex circuits still adds appreciably to the thermal resistance in a given design, and suffers from some of the same issues observed in printed circuit boards. The use of thermal vias is still limited to electrically isolating applications as described previously. And as is apparent, the use of relatively thick and rigid metallic layers, such as of copper or aluminum, does not allow one to take advantage of the flexibility of flex circuits, where such a characteristic is important in an end-use application.

The use of a heat spreader formed of sheet(s) of compressed particles of exfoliated graphite or a graphitized polymer film (such as described in U.S. Pat. No. 5,091,025, the disclosure of which is incorporated herein by reference) can remedy many of the disadvantages encountered with the use of copper or aluminum heat spreaders, since such graphite materials provide the advantage of an 80% weight reduction compared to copper, while being able to match or even exceed the thermal conductivity of copper in the in-plane direction needed for heat spreading across the surface of a printed circuit board.

Laminates in which one or more of the layers consist of graphite sheets are known in the art. These structures find utility, for example, in gasket manufacture. See U.S. Pat. No. 4,961,991 to Howard. Howard discloses various laminate structures which contain metal or plastic sheets, bonded between sheets of compressed particles of exfoliated graphite. Howard discloses that such structures can be prepared by cold-working a graphite sheet on both sides of a metal net and then press-adhering the graphite to the metal net. Howard also discloses placing a polymer resin coated cloth between two sheets of graphite while heating to a temperature sufficient to soften the polymer resin, thereby bonding the polymer resin coated cloth between the two sheets of graphite to produce a graphite laminate. Similarly, Hirschvogel, U.S. Pat. No. 5,509,993, discloses graphite/metal laminates prepared by a process which involves as a first step applying a surface active agent to one of the surfaces to be bonded. Mercuri, U.S. Pat. No. 5,192,605, also forms laminates from sheets of compressed particles of exfoliated graphite bonded to a core material which may be metal, fiberglass or carbon. Mercuri deposits and then cures a coating of an epoxy resin and particles of a thermoplastic agent on the core material before feeding core material and graphite through calender rolls to form the laminate.

In addition to their utility in gasket materials, graphite laminates also find utility as heat transfer or cooling apparatus. The use of various solid structures as heat transporters is known in the art. For example, Banks, U.S. Pat. Nos. 5,316,080 and 5,224,030 discloses the utility of diamonds and gas-derived graphite fibers, joined with a suitable binder, as heat transfer devices. Such devices are employed to passively conduct heat from a source, such as a semiconductor, to a heat sink.

As noted, the graphite material preferred for use as the heat spreader material of this invention is sheets of compressed particles of exfoliated graphite, or a graphite film formed by the graphitization of a polymer material.

Natural graphite, on a microscopic scale, is made up of layer planes of hexagonal arrays or networks of carbon atoms. These layer planes of hexagonally arranged carbon atoms are substantially flat and are oriented or ordered so as to be substantially parallel and equidistant to one another. The substantially-flat, parallel, equidistant sheets or layers of carbon atoms, usually referred to as graphene layers or basal planes, are linked or bonded together and groups thereof are arranged in crystallites. Highly-ordered graphite materials consist of crystallites of considerable size, the crystallites being highly aligned or oriented with respect to each other and having well ordered carbon layers. In other words, highly ordered graphites have a high degree of preferred crystallite orientation. It should be noted that graphites, by definition, possess anisotropic structures and thus exhibit or possess many characteristics that are highly directional, e.g., thermal and electrical conductivity and fluid diffusion.

Briefly, natural graphites may be characterized as laminated structures of carbon, that is, structures consisting of superposed layers or laminae of carbon atoms joined together by weak van der Waals forces. In considering the graphite structure, two axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers or the directions perpendicular to the "c" direction. The graphites suitable for manufacturing sheets of compressed particles of exfoliated graphite possess a very high degree of orientation.

As noted above, the bonding forces holding the parallel layers of carbon atoms together are only weak van der Waals forces. Natural graphites can be chemically treated so that the spacing between the superposed carbon layers or laminae can be appreciably opened up so as to provide a marked expansion in the direction perpendicular to the layers, that is, in the "c" direction, and thus form an expanded or intumesced graphite structure in which the laminar character of the carbon layers is substantially retained.

Natural graphite flake which has been chemically or thermally expanded and more particularly expanded so as to have a final thickness or "c" direction dimension which is as much as about 80 or more times the original "c" direction dimension, can be formed without the use of a binder into cohesive or integrated sheets of expanded graphite, e.g. webs, papers, strips, tapes, or the like. The formation of graphite particles which have been expanded to have a final thickness or "c" dimension which is as much as about 80 times or more the original "c" direction dimension into integrated flexible sheets by compression, without the use of any binding material, is believed to be possible due to the mechanical interlocking, or cohesion, which is achieved between the voluminously expanded graphite particles.

In addition to flexibility, the sheet material, as noted above, has also been found to possess a high degree of anisotropy to thermal and electrical conductivity and fluid diffusion, somewhat less, but comparable to the natural graphite starting material due to orientation of the expanded graphite particles substantially parallel to the opposed faces of the sheet resulting from very high compression, e.g. roll processing. Sheet material thus produced has excellent flexibility, good strength and a very high degree or orientation. There is a need for processing that more fully takes advantage of these properties.

Briefly, the process of producing flexible, binderless anisotropic expanded natural graphite sheet material, e.g. web, paper, strip, tape, foil, mat, or the like, comprises compressing or compacting under a predetermined load and in the absence of a binder, expanded graphite particles which have a "c" direction dimension which is as much as about 80 or more times that of the original particles so as to form a substantially flat, flexible, integrated graphite sheet. The expanded graphite particles that generally are worm-like or vermiform in appearance will, once compressed, maintain the compression set and alignment with the opposed major surfaces of the sheet. Properties of the sheets may be altered by coatings and/or the addition of binders or additives prior to the compression step. See U.S. Pat. No. 3,404,061 to Shane, et al. The density and thickness of the sheet material can be varied by controlling the degree of compression.

Lower densities are advantageous where surface detail requires embossing or molding, and lower densities aid in achieving good detail. However, higher in-plane strength and thermal conductivity are generally favored by more dense sheets. Typically, the density of the sheet material will be within the range of from about 0.04 $g/cm^3$ to about 1.4 $g/cm^3$.

Natural graphite sheet material made as described above typically exhibits an appreciable degree of anisotropy due to the alignment of graphite particles parallel to the major opposed, parallel surfaces of the sheet, with the degree of anisotropy increasing upon roll pressing of the sheet material to increased density. In roll-pressed anisotropic sheet material, the thickness, i.e. the direction perpendicular to the opposed, parallel sheet surfaces comprises the "c" direction and the directions ranging along the length and width, i.e. along or parallel to the opposed, major surfaces comprises the "a" directions and the thermal properties of the sheet are very different, by orders of magnitude typically, for the "c" and "a" directions.

In the formation of graphitized polymer films, graphite films with high crystallinity are created by the solid-state carbonization of an polymeric film such as an aromatic polyimide film or a polymellitimide film, followed by a high temperature heat treatment to create films that are carbonized without any change in shape (though a significant shrinkage does occur), and also because the carbon films can be converted to graphite through a subsequent heat treatment in an inert atmosphere.

Polyimides have been developed for use as thermoresistant polymers in a variety of electronic applications. As such, a variety of polyimide films have been produced with different molecular structures to better fit the properties of the film to the specific application. This fact allows for differing properties of the resultant graphite film as the quality and composition of the polyimide film combined with the graphitization techniques control the resultant graphitic properties.

A film such as a polyimide film is first cut and shaped to anticipate the subsequent shrinkage during the carbonization step. During carbonization a large amount of carbon monoxide may evolve from the film accompanied by a substantial shrinkage of the film. The carbonization may take place as a two step process, the first step at a substantially lower temperature than the second step. During the first step of carbonizing a polyimide film, the weight loss is primarily due to the breakage at the carbonyl groups in the imide part of the polyimide film. Specifically, the ether oxygen appears to be lost at the end of the first step. In the second step of carbonization, nitrogen gas may be released during the decomposition of the imide groups of the film.

The graphitization process includes a high temperature heat treatment with the temperature of the heat treatment resulting in different alignment of the carbon atoms. Specifically, dependent upon the selected film, pores exist between the carbon layer stacks after graphitization at certain temperatures. For example, at 2450° C., a polyimide film, after the graphitization step, may still be turbostratic as flattened pores are oriented between the carbon layers. Conversely, at 2500° C., the same film would have the pores collapse resulting in a graphitic film with virtually perfect carbon layers.

SUMMARY OF THE INVENTION

In one aspect of the present invention a handheld electronic device includes a housing and an LED light source having a circuit assembly. The circuit assembly includes a substrate including an electrical circuit structured for on and off cycling of the LED, typically such that the LED is on for about 1 second or less, more often 500 ms or less, and most often about 250 ms or less. The LED is located adjacent a first major surface of the substrate and is connected to the electrical circuit. A heat spreader which can be a sheet of compressed particles of exfoliated natural graphite or a graphitized polymer film is placed in heat conducting association with the second major surface of the substrate, where the heat spreader has a surface area greater than the surface area of the LED in contact with the substrate. The heat spreader functions such that the light source can be cycled on and off within 10 seconds for at least two cycles without an appreciable rise in the maximum temperature from cycle to cycle.

It is an object of the invention to provide a circuit assembly having improved heat spreading capabilities.

It is another object of the present invention to provide a heat spreader for use with an on and off cycling light source in a handheld device.

And another object of the present invention is the provision of a heat spreader made of flexible material so as to allow easy installation of the heat spreader and attached substrate and LED within the handheld device.

Still another object of the present invention is the provision of a circuit assembly for an LED in a handheld electronic device, which allows for operation of the light source at increased intensity, brightness, luminosity and/or luminance These and other objects are accomplished by the present invention wherein a heat spreader made of a graphite material is utilized with a light source mounted on a substrate attached to the heat spreader with the handheld device.

Other and further objects, features, and advantages of the present invention will be readily apparent to those skilled in the art, upon a reading of the following disclosure when taken in conjunction with the accompanying drawings.

BRIEF DESCRIPTION OF THE DRAWINGS

FIGS. 6-9 are cross-section elevation views taken along line X-X of FIG. 4 showing various alternative embodiments of the circuit assembly of the present invention.

DETAILED DESCRIPTION OF THE INVENTION

The present invention is based upon the finding that the thermal operation of a cycling light source in a handheld device can be substantially improved by the addition of a heat spreader made of graphite. The light source, which is preferably an LED, can operate at substantially increased power levels thus providing improved lighting, while still operating at significantly reduced operating temperatures. The use of graphite as the heat spreader also aids in mechanical factors such as the ease of installation of the assembly within the handheld device.

By the term "circuit assembly" is meant an assembly including one or more electronic circuits positioned on a dielectric material, and can include laminates where one or more of the circuits is sandwiched between layers of dielectric material. Specific examples of circuit assemblies are printed circuit boards and flex circuits, as would be familiar to the skilled artisan.

Before describing the manner in which the invention improves current materials, a brief description of graphite and its formation into flexible sheets, which will become the primary heat spreader for forming the products of the invention, is in order.

Natural graphite is a crystalline form of carbon comprising atoms covalently bonded in flat layered planes with weaker bonds between the planes. By treating natural graphite flake, with an intercalant of, e.g. a solution of sulfuric and nitric acid, the crystal structure of the graphite reacts to form a compound of graphite and the intercalant. The treated particles of graphite are hereafter referred to as "particles of intercalated graphite." Upon exposure to high temperature, the intercalant within the graphite decomposes and volatilizes, causing the particles of intercalated graphite to expand in dimension as much as about 80 or more times its original volume in an accordion-like fashion in the "c" direction, i.e. in the direction perpendicular to the crystalline planes of the graphite. The exfoliated graphite particles are vermiform in appearance, and are therefore commonly referred to as worms. The worms may be compressed together into flexible sheets that, unlike the original graphite flakes, can be formed and cut into various shapes.

Natural graphite starting materials suitable for use in the present invention include highly graphitic carbonaceous materials capable of intercalating organic and inorganic acids as well as halogens and then expanding when exposed to heat. These highly graphitic carbonaceous materials most preferably have a degree of graphitization of about 1.0. As used in this disclosure, the term "degree of graphitization" refers to the value g according to the formula:

$$g = \frac{3.45 - d(002)}{0.095}$$

where d(002) is the spacing between the graphitic layers of the carbons in the crystal structure measured in Angstrom units. The spacing d between graphite layers is measured by standard X-ray diffraction techniques. The positions of diffraction peaks corresponding to the (002), (004) and (006) Miller Indices are measured, and standard least-squares techniques are employed to derive spacing which minimizes the total error for all of these peaks. Examples of highly graphitic carbonaceous materials include natural graphites from various sources.

The natural graphite starting materials used in the present invention may contain non-graphite components so long as the crystal structure of the starting materials maintains the required degree of graphitization and they are capable of exfoliation. Generally, any carbon-containing material, the crystal structure of which possesses the required degree of graphitization and which can be exfoliated, is suitable for use with the present invention. Such graphite preferably has a purity of at least about eighty weight percent. More preferably, the graphite employed for the present invention will have a purity of at least about 94%. In the most preferred embodiment, the graphite employed will have a purity of at least about 98%.

A common method for manufacturing natural graphite sheet is described by Shane et al. in U.S. Pat. No. 3,404,061, the disclosure of which is incorporated herein by reference. In the typical practice of the Shane et al. method, natural graphite flakes are intercalated by dispersing the flakes in a solution containing e.g., a mixture of nitric and sulfuric acid, advantageously at a level of about 20 to about 300 parts by weight of intercalant solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid. Alternatively, an electric potential can be used to bring about oxidation of the graphite. Chemical species that can be introduced into the graphite crystal using electrolytic oxidation include sulfuric acid as well as other acids.

In a preferred embodiment, the intercalating agent is a solution of a mixture of sulfuric acid, or sulfuric acid and phosphoric acid, and an oxidizing agent, i.e. nitric acid, perchloric acid, chromic acid, potassium permanganate, hydrogen peroxide, iodic or periodic acids, or the like. Although less preferred, the intercalation solution may contain metal halides such as ferric chloride, and ferric chloride mixed with sulfuric acid, or a halide, such as bromine as a solution of bromine and sulfuric acid or bromine in an organic solvent.

The quantity of intercalation solution may range from about 20 to about 350 pph and more typically about 40 to about 160 pph. After the flakes are intercalated, any excess solution is drained from the flakes and the flakes are water-washed. Alternatively, the quantity of the intercalation solution may be limited to between about 10 and about 40 pph, which permits the washing step to be eliminated as taught and described in U.S. Pat. No. 4,895,713, the disclosure of which is also herein incorporated by reference.

The particles of graphite flake treated with intercalation solution can optionally be contacted, e.g. by blending, with a reducing organic agent selected from alcohols, sugars, aldehydes and esters which are reactive with the surface film of oxidizing intercalating solution at temperatures in the range of 25° C. and 125° C. Suitable specific organic agents include hexadecanol, octadecanol, 1-octanol, 2-octanol, decylalcohol, 1, 10 decanediol, decylaldehyde, 1-propanol, 1,3 propanediol, ethyleneglycol, polypropylene glycol, dextrose, fructose, lactose, sucrose, potato starch, ethylene glycol monostearate, diethylene glycol dibenzoate, propylene glycol monostearate, glycerol monostearate, dimethyl oxylate, diethyl oxylate, methyl formate, ethyl formate, ascorbic acid and lignin-derived compounds, such as sodium lignosulfate. The amount of organic reducing agent is suitably from about 0.5 to 4% by weight of the particles of graphite flake.

The use of an expansion aid applied prior to, during or immediately after intercalation can also provide improvements. Among these improvements can be reduced exfoliation temperature and increased expanded volume (also referred to as "worm volume"). An expansion aid in this context will advantageously be an organic material sufficiently soluble in the intercalation solution to achieve an improvement in expansion. More narrowly, organic materials of this type that contain carbon, hydrogen and oxygen, preferably exclusively, may be employed. Carboxylic acids have been found especially effective. A suitable carboxylic acid useful as the expansion aid can be selected from aromatic, aliphatic or cycloaliphatic, straight chain or branched chain, saturated and unsaturated monocarboxylic acids, dicarboxylic acids and polycarboxylic acids which have at least 1 carbon atom, and preferably up to about 15 carbon atoms, which is soluble in the intercalation solution in amounts effective to provide a measurable improvement of one or more aspects of exfoliation. Suitable organic solvents can be employed to improve solubility of an organic expansion aid in the intercalation solution.

Representative examples of saturated aliphatic carboxylic acids are acids such as those of the formula $H(CH_2)_nCOOH$ wherein n is a number of from 0 to about 5, including formic, acetic, propionic, butyric, pentanoic, hexanoic, and the like. In place of the carboxylic acids, the anhydrides or reactive carboxylic acid derivatives such as alkyl esters can also be employed. Representative of alkyl esters are methyl formate and ethyl formate. Sulfuric acid, nitric acid and other known aqueous intercalants have the ability to decompose formic acid, ultimately to water and carbon dioxide. Because of this, formic acid and other sensitive expansion aids are advantageously contacted with the graphite flake prior to immersion of the flake in aqueous intercalant. Representative of dicarboxylic acids are aliphatic dicarboxylic acids having 2-12 carbon atoms, in particular oxalic acid, fumaric acid, malonic acid, maleic acid, succinic acid, glutaric acid, adipic acid, 1,5-pentanedicarboxylic acid, 1,6-hexanedicarboxylic acid, 1,10-decanedicarboxylic acid, cyclohexane-1, 4-dicarboxylic acid and aromatic dicarboxylic acids such as phthalic acid or terephthalic acid. Representative of alkyl esters are dimethyl oxylate and diethyl oxylate. Representative of cycloaliphatic acids is cyclohexane carboxylic acid and of aromatic carboxylic acids are benzoic acid, naphthoic acid, anthranilic acid, p-aminobenzoic acid, salicylic acid, o-, m- and p-tolyl acids, methoxy and ethoxybenzoic acids, acetoacetamidobenzoic acids and, acetamidobenzoic acids, phenylacetic acid and naphthoic acids. Representative of hydroxy aromatic acids are hydroxybenzoic acid, 3-hydroxy-1-naphthoic acid, 3-hydroxy-2-naphthoic acid, 4-hydroxy-2-naphthoic acid, 5-hydroxy-1-naphthoic acid, 5-hydroxy-2-naphthoic acid, 6-hydroxy-2-naphthoic acid and 7-hydroxy-2-naphthoic acid. Prominent among the polycarboxylic acids is citric acid.

The intercalation solution will be aqueous and will preferably contain an amount of expansion aid of from about 1 to 10%, the amount being effective to enhance exfoliation. In the embodiment wherein the expansion aid is contacted with the graphite flake prior to or after immersing in the aqueous intercalation solution, the expansion aid can be admixed with the graphite by suitable means, such as a V-blender, typically in an amount of from about 0.2% to about 10% by weight of the graphite flake.

After intercalating the graphite flake, and following the blending of the intercalant coated intercalated graphite flake with the organic reducing agent, the blend is exposed to temperatures in the range of 25° to 125° C. to promote reaction of the reducing agent and intercalant coating. The heating period is up to about 20 hours, with shorter heating periods, e.g., at least about 10 minutes, for higher temperatures in the above-noted range. Times of one half hour or less, e.g., on the order of 10 to 25 minutes, can be employed at the higher temperatures.

The thusly treated particles of graphite are sometimes referred to as "particles of intercalated graphite." Upon exposure to high temperature, e.g. temperatures of at least about 160° C. and especially about 700° C. to 1000° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms. The worms may be compressed together into flexible sheets (referred to herein as sheets of compressed particles of exfoliated graphite) that, unlike the original graphite flakes, can be formed and cut into various shapes.

Graphite sheet and foil are coherent, with good handling strength, and are suitably compressed, e.g. by roll pressing, to a thickness of about 0.075 mm to 3.75 mm and a typical density of about 0.1 to 1.5 grams per cubic centimeter (g/cm$^3$). From about 1.5-30% by weight of ceramic additives can be blended with the intercalated graphite flakes as described in U.S. Pat. No. 5,902,762 (which is incorporated herein by reference) to provide enhanced resin impregnation in the final flexible graphite product. The additives include ceramic fiber particles having a length of about 0.15 to 1.5 millimeters. The width of the particles is suitably from about 0.04 to 0.004 mm. The ceramic fiber particles are non-reactive and non-adhering to graphite and are stable at temperatures up to about 1100° C., preferably about 1400° C. or higher. Suitable ceramic fiber particles are formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like.

The above described methods for intercalating and exfoliating graphite flake may beneficially be augmented by a pretreatment of the graphite flake at graphitization temperatures, i.e. temperatures in the range of about 3000° C. and above and by the inclusion in the intercalant of a lubricious additive, as described in International Patent Application No. PCT/US02/39749, the disclosure of which is incorporated herein by reference.

The pretreatment, or annealing, of the graphite flake results in significantly increased expansion (i.e., increase in expansion volume of up to 300% or greater) when the flake is subsequently subjected to intercalation and exfoliation. Indeed, desirably, the increase in expansion is at least about 50%, as compared to similar processing without the annealing step. The temperatures employed for the annealing step should not be significantly below 3000° C., because temperatures even 100° C. lower results in substantially reduced expansion.

The annealing of the present invention is performed for a period of time sufficient to result in a flake having an enhanced degree of expansion upon intercalation and subsequent exfoliation. Typically the time required will be 1 hour or more, preferably 1 to 3 hours and will most advantageously proceed in an inert environment. For maximum beneficial results, the annealed graphite flake will also be subjected to other processes known in the art to enhance the degree expansion—namely intercalation in the presence of an organic reducing agent, an intercalation aid such as an organic acid, and a surfactant wash following intercalation. Moreover, for maximum beneficial results, the intercalation step may be repeated.

The annealing step of the instant invention may be performed in an induction furnace or other such apparatus as is known and appreciated in the art of graphitization; for the temperatures here employed, which are in the range of 3000° C., are at the high end of the range encountered in graphitization processes.

Because it has been observed that the worms produced using graphite subjected to pre-intercalation annealing can sometimes "clump" together, which can negatively impact area weight uniformity, an additive that assists in the formation of "free flowing" worms is highly desirable. The addition of a lubricious additive to the intercalation solution facilitates the more uniform distribution of the worms across the bed of a compression apparatus (such as the bed of a calender station) conventionally used for compressing (or "calendering") graphite worms into flexible graphite sheet. The resulting sheet therefore has higher area weight uniformity and greater tensile strength. The lubricious additive is preferably a long chain hydrocarbon, more preferably a hydrocarbon having at least about 10 carbons. Other organic compounds having long chain hydrocarbon groups, even if other functional groups are present, can also be employed.

More preferably, the lubricious additive is an oil, with a mineral oil being most preferred, especially considering the fact that mineral oils are less prone to rancidity and odors, which can be an important consideration for long term storage. It will be noted that certain of the expansion aids detailed above also meet the definition of a lubricious additive. When these materials are used as the expansion aid, it may not be necessary to include a separate lubricious additive in the intercalant.

The lubricious additive is present in the intercalant in an amount of at least about 1.4 pph, more preferably at least about 1.8 pph. Although the upper limit of the inclusion of lubricous additive is not as critical as the lower limit, there does not appear to be any significant additional advantage to including the lubricious additive at a level of greater than about 4 pph.

The natural graphite sheets of the present invention may, if desired, utilize particles of reground graphite sheets rather than freshly expanded worms, as discussed in U.S. Pat. No. 6,673,289 to Reynolds, Norley and Greinke, the disclosure of which is incorporated herein by reference. The sheets may be newly formed sheet material, recycled sheet material, scrap sheet material, or any other suitable source.

Also the processes of the present invention may use a blend of virgin materials and recycled materials.

The source material for recycled materials may be sheets or trimmed portions of sheets that have been compression molded as described above, or sheets that have been compressed with, for example, pre-calendering rolls, but have not yet been impregnated with resin. Furthermore, the source material may be sheets or trimmed portions of sheets that have been impregnated with resin, but not yet cured, or sheets or trimmed portions of sheets that have been impregnated with resin and cured. The source material may also be recycled flexible graphite proton exchange membrane (PEM) fuel cell components such as flow field plates or electrodes. Each of the various sources of graphite may be used as is or blended with natural graphite flakes.

Once the source material of graphite sheets is available, it can then be comminuted by known processes or devices, such as a jet mill, air mill, blender, etc. to produce particles.

Preferably, a majority of the particles have a diameter such that they will pass through 20 U.S. mesh; more preferably a major portion (greater than about 20%, most preferably greater than about 50%) will not pass through 80 U.S. mesh. Most preferably the particles have a particle size of no greater than about 20 U.S. mesh. It may be desirable to cool the graphite sheet when it is resin-impregnated as it is being comminuted to avoid heat damage to the resin system during the comminution process.

The size of the comminuted particles may be chosen so as to balance machinability and formability of the graphite article with the thermal characteristics desired. Thus, smaller particles will result in a graphite article which is easier to machine and/or form, whereas larger particles will result in a graphite article having higher anisotropy, and, therefore, greater in-plane electrical and thermal conductivity.

Once the source material is comminuted, it is then re-expanded. The re-expansion may occur by using the intercalation and exfoliation process described above and those described in U.S. Pat. No. 3,404,061 to Shane et al. and U.S. Pat. No. 4,895,713 to Greinke et al.

Typically, after intercalation the particles are exfoliated by heating the intercalated particles in a furnace. During this exfoliation step, intercalated natural graphite flakes may be added to the recycled intercalated particles. Preferably, during the re-expansion step the particles are expanded to have a specific volume in the range of at least about 100 cc/g and up to about 350 cc/g or greater. Finally, after the re-expansion step, the re-expanded particles may be compressed into flexible sheets, as hereinafter described.

According to the invention, graphite sheets prepared as described above (which typically have a thickness of about 0.075 mm to about 10 mm, but which can vary depending, e.g., on the degree of compression employed) are can be treated with resin and the absorbed resin, after curing, enhances the moisture resistance and handling strength, i.e. stiffness, of the sheet as well as "fixing" the morphology of the sheet. The amount of resin within the epoxy impregnated graphite sheets should be an amount sufficient to ensure that the final assembled and cured layered structure is dense and cohesive, yet the anisotropic thermal conductivity associated with a densified graphite structure has not been adversely impacted. Suitable resin content is preferably at least about 5% by weight, more preferably about 10 to 35% by weight, and suitably up to about 60% by weight.

Resins found especially useful in the practice of the present invention include acrylic-, epoxy- and phenolic-based resin systems, fluoro-based polymers, or mixtures thereof. Suitable epoxy resin systems include those based on diglycidyl ether of bisphenol A (DGEBA) and other multi-functional resin systems; phenolic resins that can be employed include resole and novolac phenolics. Optionally, the graphite may be impregnated with fibers and/or salts in addition to the resin or in place of the resin. Additionally, reactive or non-reactive additives may be employed with the resin system to modify properties (such as tack, material flow, hydrophobicity, etc.).

One type of apparatus for continuously forming resin-impregnated and compressed natural graphite materials is shown in U.S. Pat. No. 6,706,400 to Mercuri, Capp, Warddrip and Weber, the disclosure of which is incorporated herein by reference.

Advantageously, when the sheets of compressed particles of exfoliated graphite are resin-impregnated, following the compression step (such as by calendering), the impregnated materials are cut to suitable-sized pieces and placed in a press, where the resin is cured at an elevated temperature. In addition, the natural graphite sheets can be employed in the form of a laminate, which can be prepared by stacking together individual graphite sheets in the press.

The temperature employed in the press should be sufficient to ensure that the graphite structure is densified at the curing pressure, while the thermal properties of the structure are not adversely impacted. Generally, this will require a temperature of at least about 90° C., and generally up to about 200° C. Most preferably, cure is at a temperature of from about 150° C. to 200° C. The pressure employed for curing will be somewhat a function of the temperature utilized, but will be sufficient to ensure that the graphite structure is densified without adversely impacting the thermal properties of the structure. Generally, for convenience of manufacture, the minimum required pressure to densify the structure to the required degree will be utilized. Such a pressure will generally be at least about 7 megapascals (Mpa, equivalent to about 1000 pounds per square inch), and need not be more than about 35 Mpa (equivalent to about 5000 psi), and more commonly from about 7 to about 21 Mpa (1000 to 3000 psi). The curing time may vary depending on the resin system and the temperature and pressure employed, but generally will range from about 0.5 hours to 2 hours. After curing is complete, the materials are seen to have a density of at least about 1.8 g/cm$^3$ and commonly from about 1.8 g/cm$^3$ to 2.0 g/cm$^3$.

Advantageously, when the natural graphite sheets are themselves presented as a laminate, the resin present in the impregnated sheets can act as the adhesive for the laminate. According to another embodiment of the invention, however, the calendered, impregnated, natural graphite sheets are coated with an adhesive before the are stacked and cured. Suitable adhesives include epoxy-, acrylic- and phenolic-based resins. Phenolic resins found especially useful in the practice of the present invention include phenolic-based resin systems including resole and novolak phenolics.

Although the formation of sheets through calendering or molding is the most common method of formation of the graphite materials useful in the practice of the present invention, other forming methods can also be employed.

As noted above, the graphite employed can also be graphitized polymer films.

For use as a heat spreader in accordance with the present invention, the graphite sheets have in-plane thermal conductivity rivaling or exceeding that of copper, at a fraction of the weight of copper. More specifically, the composites exhibit in-plane thermal conductivities of at least about 220 W/m°K, more preferably at least about 300 W/m°K, with through-plane thermal conductivities of less than about 15 W/m°K, more preferably less than about 10 W/m°K.

Figure 1:
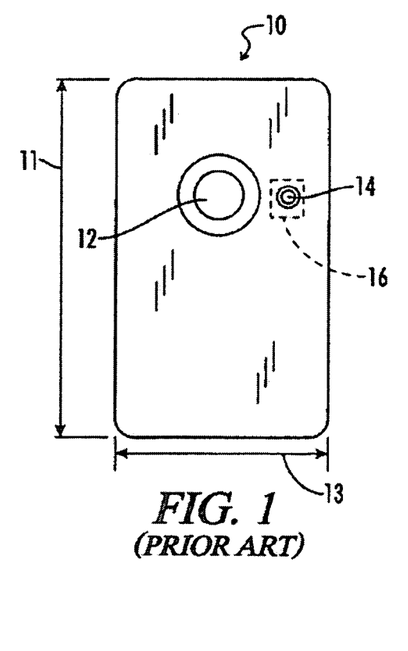
FIG. 1 is an elevation view of a typical prior art handheld cell phone showing a camera mounted on a back portion thereof, and showing in dashed lines a representation of the location of a circuit assembly having an LED mounted on a flex circuit mounted on a glass fiber laminate base.
Figure 2:
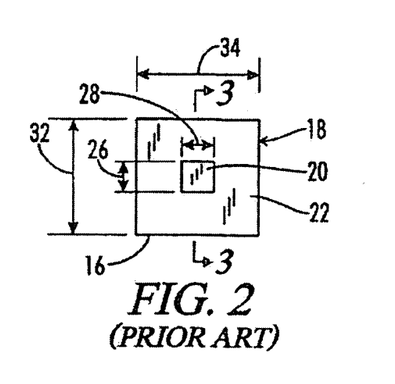
FIG. 2 is an enlarged elevation view of the circuit assembly utilized in the prior art device of FIG. 1.
Figure 3:
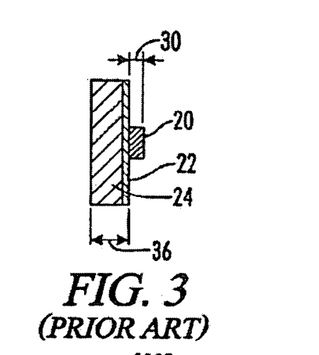
FIG. 3 is an elevation section view taken along line 3-3 of the prior art circuit assembly of FIG. 2.

The Prior Art Construction of FIGS. 1-3

Referring now to FIGS. 1-3 a typical conventional prior art construction for a flash LED in a handheld device such a cell phone is shown.

A rear elevation view of a cell phone 10 is shown in FIG. 1. The cell phone 10 includes a rear facing camera 12 with a light source 14 adjacent the camera 12.

In dashed lines indicated by the numeral 16 there is shown the outline and general location within the housing of the cell phone 10 of a circuit assembly 18 which is shown in enlarged view in FIGS. 2 and 3.

The circuit assembly 18 includes a flash LED 20 located on a flex circuit 22 which is supported by a stiffener pad 24.

In a typical prior art camera, for example a Nokia Model 6280, the LED 20 may be a Lumileds LUXEON flash model LXCL-PWF1, which has an approximate length 26 of 2.0 mm, a width 28 of 1.6 mm and a thickness 30 of 0.7 mm. The flex circuit 22 is formed on a polyimide base and has a length 32 of 5 mm and a width 34 of 5 mm and a thickness as seen in FIG. 3 of 0.0254 mm. The polyimide based flex circuit 22 has a thermal conductivity of 0.37 W/mK. The polyimide material may more generally be referred to as a dielectric layer, and is often formed of polymer material or even a ceramic layer, such as alumina for example.

The stiffener pad 24 has identical length and width dimensions 32 and 34 to that of the flex shell 24, namely 5 mm×5 mm and has a thickness 36 as seen in FIG. 3 of 0.381 mm. The stiffener pad 24 is often a material like FR4, which has a thermal conductivity of about 0.4 W/mK.

The cell phone 10 has a length 11 of 3.0 inches, a width 13 of 1.5 inches, and a thickness (not shown) normal to the plane of FIG. 1 of approximately 0.25 inches.

The prior art design of FIGS. 1-3 is typically operated at 500 mA power for flash mode and only at 100 mA for torch mode. The torch mode can be used for shooting video but the current main use is for still camera autofocus functions when the ambient light is not sufficient. This has a direct impact on picture quality.

Present Invention of FIGS. 4-10

Figure 10:
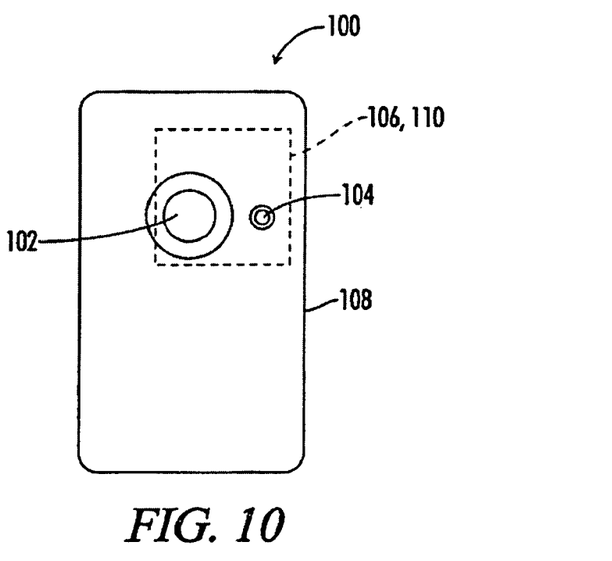
FIG. 10 is a elevation view of a handheld device of the present invention showing in dashed lines the approximate location of the graphite heat spreader of the present invention within the housing of the handheld device.

Referring now to FIG. 10, a rear elevation view is there shown of a cell phone or other handheld electronic device 100 of the present invention. The device 100 has a camera 102 located therein and has an LED light source 104 adjacent the camera 102. The outline of the outer profile of the LED light source 104 and its associated circuit assembly 110 is shown in dashed lines as 106.

Figure 4:
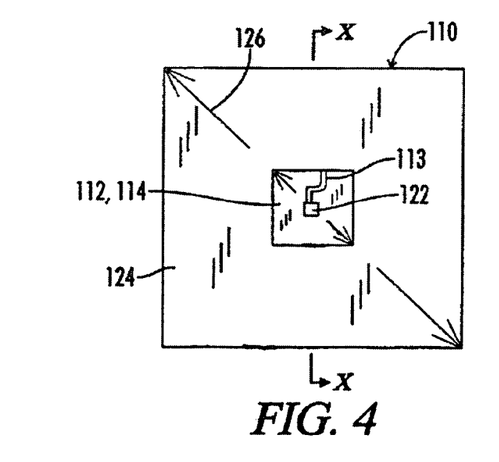
FIG. 4 is an elevation view of the circuit assembly of the present invention wherein an LED is mounted on a flex circuit which is mounted upon a graphite heat spreader. In the embodiment of FIG. 4, the flex circuit is mounted substantially in the center of the heat spreader.

FIG. 4 shows an elevation view of the circuit assembly 110 of the LED light source 104 of device 100.

FIGS. 6, 7, 8 and 9 are all cross-sectional views of the circuit assembly 110 taken along line X-X of FIG. 4, with each of the views of FIGS. 6, 7, 8 and 9 showing alternative constructions of the circuit assembly 110. The embodiments of FIGS. 6, 7, 8 and 9 are identified as 110A, 110B, 110C and 110D, respectively.

Figure 6:
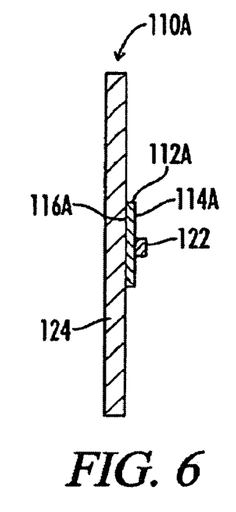
FIG. 6 shows an LED mounted on a flex circuit which is mounted on a graphite heat spreader.

In each case, the circuit assembly 110 includes a substrate 112 which in turn includes an electrical circuit 113. As seen in FIG. 6, the substrate 112 has first and second major surfaces 114 and 116 which are generally planar. In the embodiment shown in FIG. 6, the substrate 112A is a flex circuit. The substrate 112A includes a dielectric layer formed, such as one formed of polymer material like polyimide.

In the elevation view of FIG. 4, the substrate 12 has a rectangular shape; of course the substrate 112 can have any desired shape, whether rectangular, circular or irregular.

The circuit assembly 110 includes a light emitting diode (LED) 122 located adjacent the first major planar surface 114 of the substrate 112 and connected to the electrical circuit 113. Multiple LED sources may also be used. LED 122 is in contact with the surface 114 of substrate 112 across a certain surface area of LED 122, and is in thermal contact with surface 114 of substrate 112 over a certain area, denoted profile 122a (by thermal contact is meant sufficiently close spatial relationship such that heat generated by LED 122 is transferred to substrate 112 across profile 122a.

The circuit assembly 110 further includes a heat spreader 124 constructed of graphite, which can be generally described as including a sheet of compressed particles of exfoliated graphite or a graphitized polymer film. The heat spreader 124 may be of any desired thickness and may be a lamination of a plurality of graphite sheets as described above. The heat spreader 124 is placed in heat conducting association with the second major surface 116 of the substrate 112. The heat spreader 124 itself has a surface area which is greater than profile 122a of LED 122 as seen in FIG. 4. As is apparent in FIG. 4, the maximum heat spreader dimension 126 is greater than the profile 122a of LED 122 which provides improved spreading of heat energy and reduction of maximum temperatures of the LED 122.

The dimensions of the LED 122 and the substrate or flex circuit 112 in FIG. 4 may for example be identical to those of the prior art LED 20 and flex circuit 22 described above with regard to FIGS. 2 and 3. Thus it is apparent that the LED 122 has a maximum LED dimension which may be the diagonal of the rectangular LED 122 as seen in FIG. 4, which is less than the maximum heat spreader dimension 126.

It will be appreciated that the LED 122 and the heat spreader 124 may be attached to the first and second major surfaces 114 and 116 of the substrate 112 either directly or by various thermal interfaces such as a thermal grease, a thin sheet of flexible graphite material, or any other interface which provides thermal conductivity between the components. Alternatively, the LED 122 and the heat spreader 124 may be attached to the first and second major surfaces 114 and 116 of the substrate 112 by use of an adhesive, with solder, or without any attachment means.

The circuit 113 on the flex circuit of FIG. 6 is conventionally formed of copper, applied to the dielectric layer by photolithographic methods, sputtering, screen printing or the like. The circuit can also be formed of a conductive ink applied to the dielectric by, for example, printing or silk screening processes.

Figure 7:
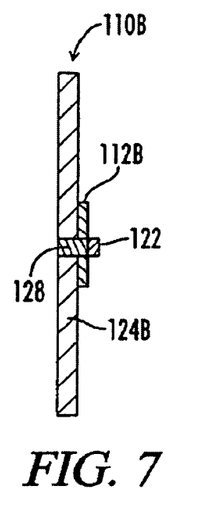
FIG. 7 shows a circuit assembly similar to that of FIG. 6 except with the addition of a thermal via extending through the flex circuit and the graphite heat spreader.

FIG. 7 shows an alternative embodiment which is similar to that of FIG. 6 except for the addition of a thermal via 128 upon which the LED 122 is mounted. The thermal via may be a cylindrical slug of highly thermally conductive material such as copper and as shown in FIG. 7 the via 128 extends through the substrate or flex circuit 112B and into and through the graphite material of the heat spreader 124B.

The thermal via 128 may be constructed in many different ways, and can be any of the embodiments of thermal via as shown in described in pending parent U.S. patent application Ser. No. 11/339,338, entitled "Heat Spreaders With Vias", filed on Jan. 5, 2006, and assigned to the assignee of the present invention, the details of which are incorporated herein by reference. The thermal via 128 extends through the substrate 112B into thermal engagement with the heat spreader 124B, and the LED 122 is mounted upon the thermal via 128.

Figure 8:
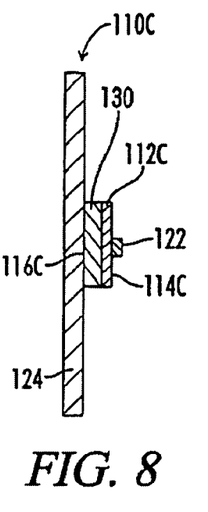
FIG. 8 shows an LED mounted upon a flex circuit, mounted upon a glass fiber laminate base mounted upon a graphite heat spreader.

FIG. 8 shows another alternative embodiment of the circuit assembly 110° C. In the embodiment of FIG. 8, a stiffener pad 130 is located between the flex circuit 112 and the graphite heat spreader 124. In this case the pad 130 and the flex circuit 112 can collectively be defined as the substrate, with the LED 122 mounted on the first major surface 114° C. of the substrate and with the heat spreader 124 attached to the second major surface 116° C. of the substrate.

Figure 9:
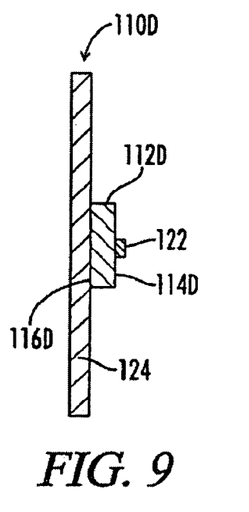
FIG. 9 shows an LED mounted upon a printed circuit board mounted upon a graphite heat spreader.

A final version of the circuit assembly 110D shown in FIG. 9 has the LED 122 mounted on a substrate 112D which in this embodiment is a printed circuit board made of FR4 material having the electrical circuit 113 printed thereon. The LED 122 is mounted on a first major surface 114D of the printed circuit board 112D and the heat spreader 124 is attached to the second major surface 116D of the printed circuit board 112D.

For the printed circuit board 112D, the dielectric layer can be that conventional in the printed circuit board industry, such as glass fiber with resin (FR4), preferably formed as a laminate; polytetrafluoroethylene (PTFE), commercially available as Teflon® brand material; and expanded PTFE, sometimes denoted as ePTFE, as well as resin impregnated or imbibed versions of the foregoing, a ceramic such as alumina and the like.

Figure 5:
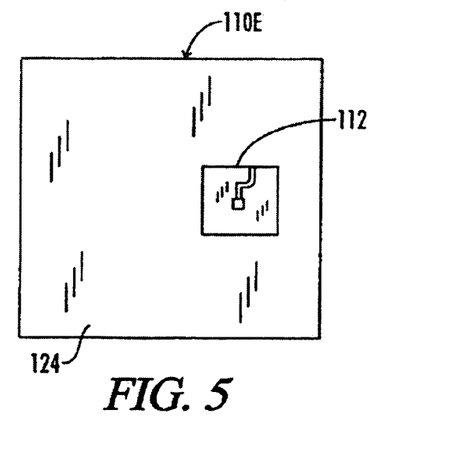
FIG. 5 is a view similar to FIG. 4 showing a flex circuit mounted off center on the heat spreader.

FIG. 5 shows another variation on the circuit assembly 110 which in this case is designated as 110E. The difference between the circuit assembly 110E of FIG. 5 and the circuit assembly 110 of FIG. 4 is simply that the substrate 112 may be located at any desired location on the heat spreader 124 and is not necessary centered as shown in FIG. 4. It will be appreciated that while the optimum heat distribution can typically be obtained with the heat source centered on the heat spreader 124, that is not required and very acceptable results can still be achieved with an off center mounting of the heat source on the heat spreader 124 due to the very high in plane thermal conductivity of the thermal heat spreader 124.

Comparative Data

The following discussion of comparative performance data of the present invention as contrasted to a prior art system like that of FIGS. 1-3 is focused on the embodiment of FIG. 6 which has the LED 122 mounted on a 5 mm×5 mm flex circuit 112 which is in turn mounted upon the graphite heat spreader 124. The data of FIGS. 11-17 was generated by computer modeling.

It will be understood that in a typical handheld device wherein the LED 122 is being used as a light source for the camera 102, the light source can operate in one of two modes. The first mode referred to as a flash mode is, as the name implies, the use of a very bright light intensity over a very short time period in order to provide light at the instant of the taking of a picture. The second mode of operation is referred to as "torch" mode in which case the light source is operated at a lower intensity but over a longer time as might for example be desired when taking video pictures.

Figure 11:
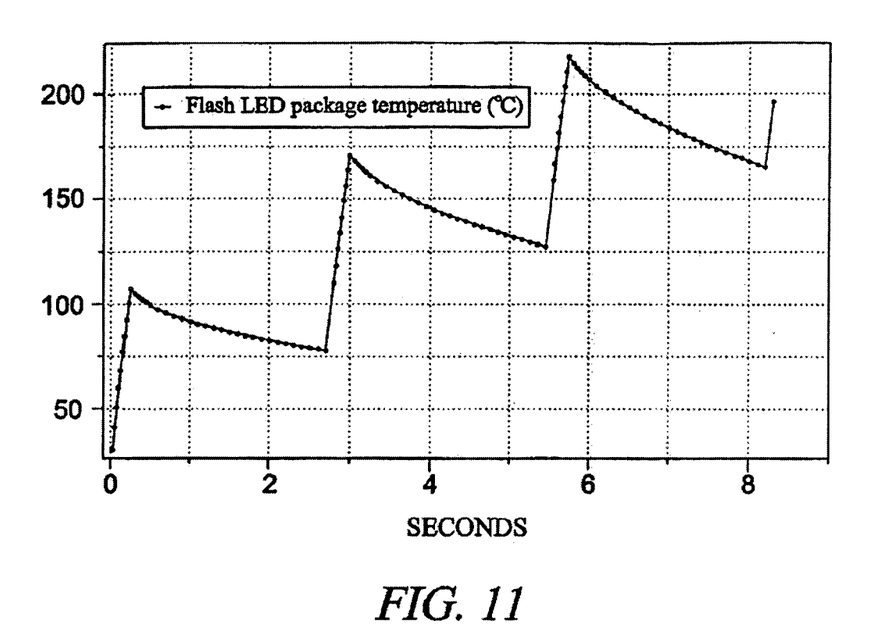
FIG. 11 is a graphical representation of temperature versus time for an LED of the prior art like that of FIGS. 1-3 operating in flash mode.
Figure 12:
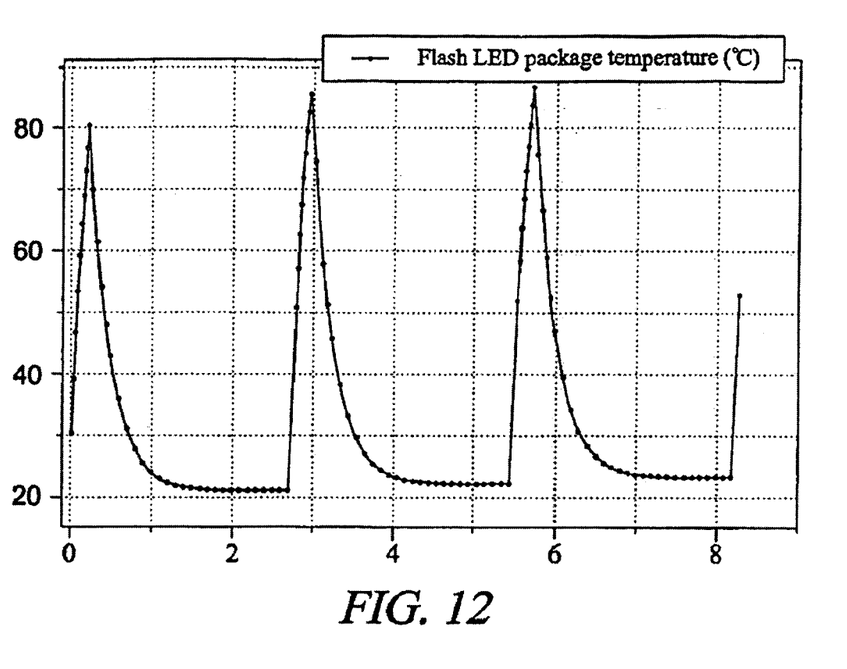
FIG. 12 is a graphical representation of temperature versus time for the light source of the present invention operating in flash mode showing the significantly lower operating temperatures and much faster recovery times as compared to the prior art results of FIG. 11.

FIGS. 11 and 12 show contrasting graphical representations of operating temperatures versus time for the prior art system of FIGS. 1-3 in FIG. 11 and for the present invention as shown in FIGS. 4 and 6 in FIG. 12.

The temperature displayed in each case is the temperature at the p-n junction within the LED 122 itself (not shown), and this temperature is typically referred to in the industry as Tj. The flash mode analyzed in FIGS. 11 and 12 was modeled as a 3.0 W flash generated in a pulse of 250 ms and allowing a recovery time of 2.5 seconds. The flash mode of 3.0 W corresponds to 800 mA at 3.75 V.

As shown in FIG. 11, for the prior art system the operating temperature for the first flash reached approximately 110° C. and within the 2.5 second cycle time had only cooled off to approximately 75° C., with the second flash taking operating temperatures to approximately 170° C. As can be seen in FIG. 11, the prior art system continually steps up to higher and higher operating temperatures so that on only the third flash, the operating temperature has substantially exceeded 200° C.

Contrasting that to the present invention as shown in FIG. 12, it is seen that for the present invention on the first flash the operating temperature only reaches approximately 80° C. and within the 2.5 second cycle time recovers to near ambient with the second and third flashes only reaching operating temperatures slightly above 80° C. Thus with the present invention operating in flash mode, the camera can repeatedly flash every 2.5 seconds with very acceptable operating temperatures of only slightly over 80° C., whereas only a few flashes with the prior art system rapidly reach unacceptable operating temperatures.

As shown in the data of FIG. 12, the heat spreader 124 is sized such that the LED 122 can operate in the flash mode with a flash duration of at least about 250 ms with a recovery time of no greater than about 2 seconds, at ambient temperatures of at least about 20° C. This allows the user to get much brighter pictures and also to take many more flash pictures per minute than are permissible with the prior art system.

In the modeling for the flash mode shown in FIG. 12, the heat spreader 124 was modeled as a 0.8 mm thick heat spreader with a length and width of 25 mm×25 mm, constructed of SPREADERSHIELD™ natural graphite material available from Advanced Energy Technology Inc., and having an in plane thermal conductivity of approximately 400 W/mK. More generally, the heat spreader 124 should have an in-plane thermal conductivity of at least about 220 W/mK and more preferably at least about 400 W/mK.

In the torch mode, the systems are modeled utilizing 0.5 W of constant heat generated in the LED package which corresponds to a current of 150 mA at a voltage of 3.2 V.

Figure 13:
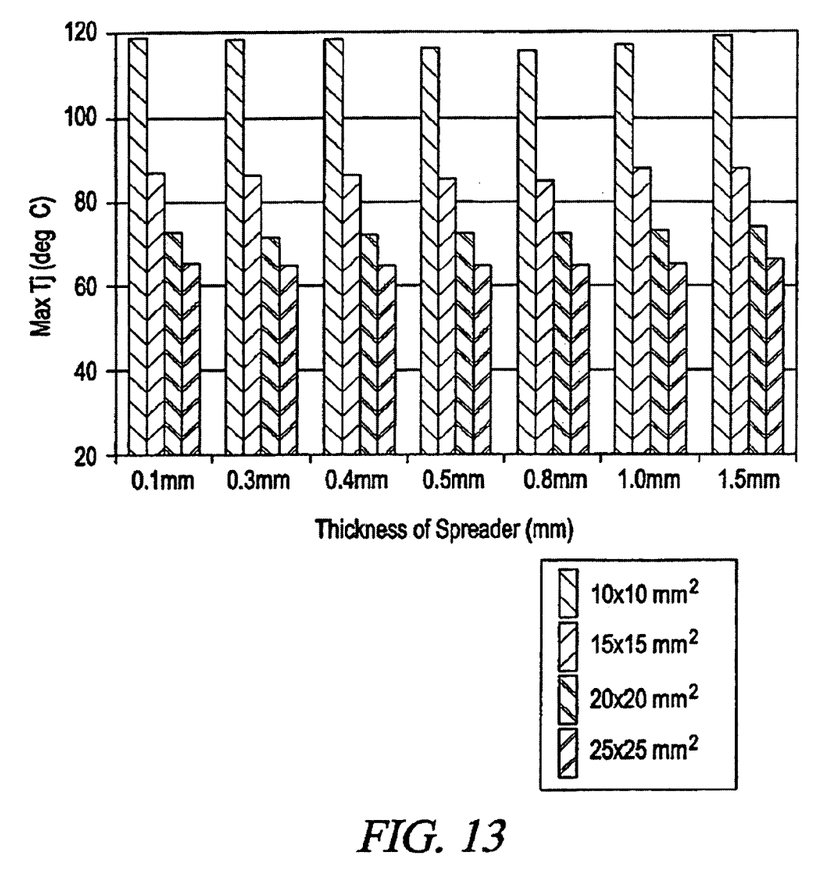
FIG. 13 is a bar chart representation of maximum temperature versus various possible dimensions of the graphite heat spreader of the present invention.

FIG. 13 displays in a bar chart format the calculated Tj for various thicknesses of the graphite material and for various lengths and widths of the heat spreader 124. The thicknesses analyzed range from 0.1 mm to 1.5 mm, and the planar dimensions analyzed range from 10 mm×10 mm to 25 mm×25 mm, with the heat shield being analyzed as a square heat shield in all cases.

As can be seen from this data, the optimum dimensions for the heat spreader 124 in this particular analysis were a 0.8 mm thickness having an area of 25 mm×25 mm. This is the dimensional package for the heat spreader 124 which has been used in the modeling of the present invention as shown in FIG. 12 and in the following FIGS. 14, 15 and 17.

Figure 14:
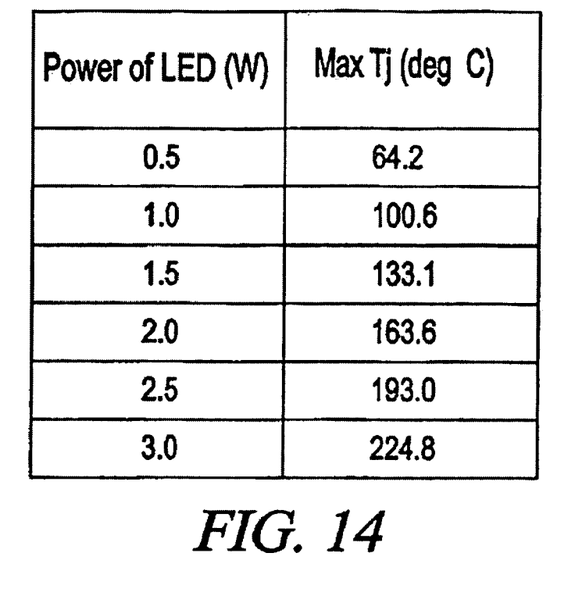
FIG. 14 is a chart representative of the maximum power placed through the LED light source and the corresponding maximum temperature at the junction between the LED and the underlying substrate.
Figure 15:
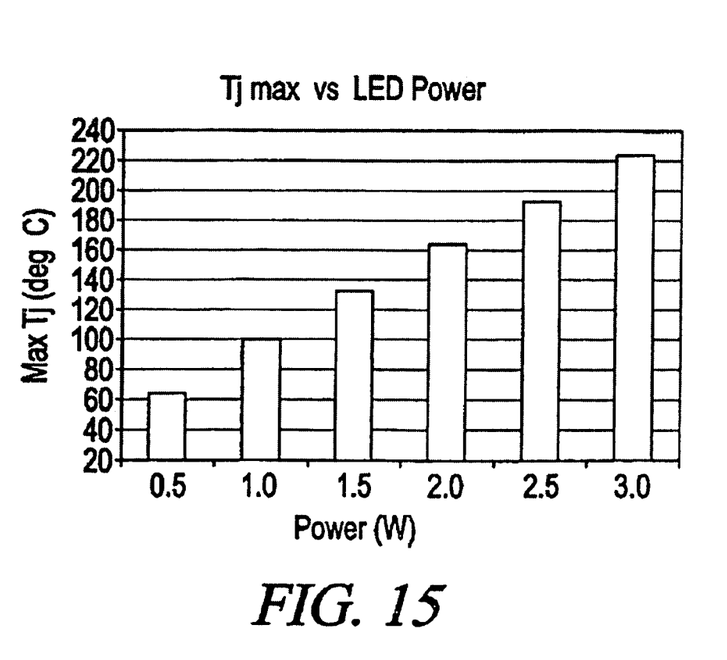
FIG. 15 is a bar chart representation of the data of FIG. 14.

FIG. 14 is a tabular display of the maximum operating temperature at the junction in degrees C. for various power inputs to the LED 122 ranging from 0.5 W to 3.0 W. These tests were run assuming a 20° C. ambient temperature. FIG. 15 is a bar chart display of the same data as FIG. 14.

The maximum specified operating temperature for the Lumileds LUXEON Flash LXCL-PWF is 135° C. As is apparent from FIGS. 14 and 15, with the use of the 25 mm×25 mm×0.8 mm thick heat spreader 124, it is possible to drive the LED 122 in torch (continuous) mode up to 1.5 W which corresponds to 350 mA, while still achieving a max Tj less than the 135° C. selected operating limit.

Figure 16:
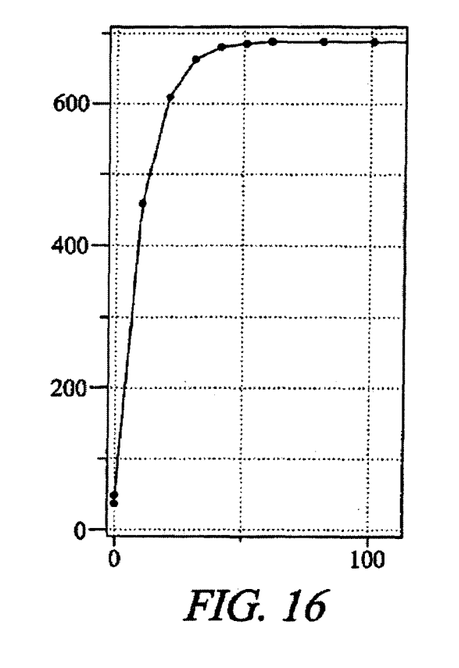
FIG. 16 is a graphical representation of temperature versus time for the LED light source of the prior art structure of FIGS. 1-3 operating in a continuous or "torch" mode.
Figure 17:
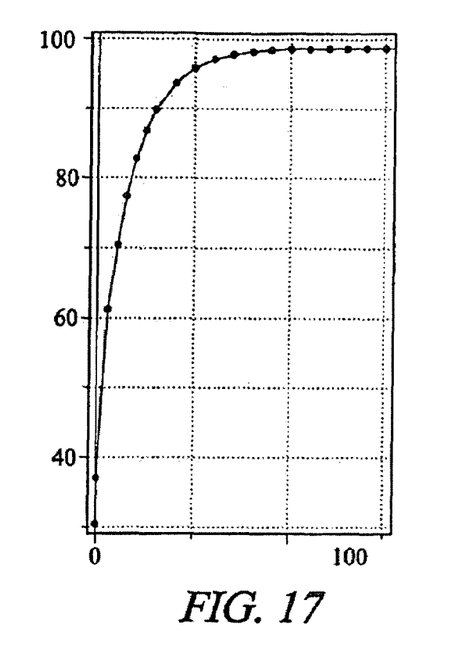
FIG. 17 is a graphical illustration of temperature versus time for the circuit assembly of the present invention showing the significantly lower operating temperatures achieved in torch mode with the present invention.

FIGS. 16 and 17 show the contrasting temperature versus time curve for the prior art system of FIGS. 1-3 as contrasted to the present invention operating in torch mode. It is very important to note the drastically different vertical scales on FIGS. 16 and 17.

The data of FIGS. 16 and 17 shows transient responses using the 25 mm×25 mm by 0.8 mm thick heat spreader 124, with the LED 122 being driven in torch (continuous) mode at a 1.5 W or 350 mA load at 20° C. ambient. It is seen that with the prior art system of FIGS. 1-3 the unit fails before it reaches its maximum temperature, which approaches 700° C., whereas with the system of the present invention the maximum temperature remains below 100° C.

Based upon the data seen in FIG. 13 it can be seen that the heat spreader 124 has a Tj of no greater than 120° C. for thicknesses anywhere in the range of from about 0.1 mm to about 1.5 mm, and for planar dimensions ranging from 10 mm×10 mm to 25 mm×25 mm. A preferred thickness range is from about 0.1 mm to 1.0 mm for compressed particles of exfoliated graphite, and from about 0.005 mm to about 0.1 mm for graphitized polymer films.

Thus as shown by the data of FIG. 17 the heat spreader 124 is sized such that the LED 122 can operate in the torch mode at power levels of at least about 350 mA and at ambient temperature of at least about 20° C. This torch mode of 350 mA corresponds to a power level of at least about 1.5 W. More generally, the heat spreader 124 is sized such that the LED 122 can operate in a torch mode at a power level of at least about 1.0 W and more preferably at about 1.5 W at ambient temperature of at least about 20° C., all while maintaining Tj less than 135° C.

The prior art devices such as those of FIGS. 1-3 currently operate in the torch mode only at relatively low power levels of 100 mA, but with the addition of the heat spreader 124 of the present invention the LED 122 will be allowed to be driven at much higher current as high as 1.5 A thus increasing light output and brightness while still maintaining maximum temperature at the junction between the LED 122 and the flex circuit 112 at an acceptable level.

The heat spreader 124 constructed from the SPREADERSHIELD™ natural graphite material having a thickness of 0.8 mm is a very flexible article and it will be appreciated that it can easily conform to and flex with the flex circuit 112A, 112B or 112C and that it can be easily bent so as to be installed in and fit within the housing 108 of the handheld device 100. As will be appreciated by those skilled in the art, space is at a premium in small electronic devices and there are many components which must be fit within the housing 108. By the use of a flexible heat spreader 124 which can be easily bent to be inserted in and to fit within the available space within the housing 108, installation is much easier with the flexible heat spreader than it would be with a relatively rigid heat spreader such as one made, for example, from copper.

In addition, in certain circumstances it may be desirable to at least partially encapsulate heat spreader layer 124 or provide a coating on a surface of heat spreader layer 124 to prevent particulate matter from flaking off heat spreader layer 124. For instance, there is the perception by some that graphite materials are prone to flaking. Whether true or not, providing a coating of a polymeric material (typically on the order of less than 20 microns in thickness) such as Mylar material to inhibit flaking can allay this perception. In this case, the polymeric material can act as dielectric layer for the circuit assembly, since the material used can be electrically non-conductive, yet thin enough to not substantially interfere with thermal conduction to heat spreader layer 124.

Heat spreader layer 124 is not necessarily planar, but may include one or more "bends," to form a 3-dimensional shape. This is especially advantageous where it is desired that circuit assembly 110 is on a different plane from heat spreader layer 124.

All cited patents, patent applications and publications referred to in this application are incorporated by reference.

The above description is intended to enable the person skilled in the art to practice the invention. It is not intended to detail all of the possible variations and modifications that will become apparent to the skilled worker upon reading the description. It is intended, however, that all such modifications and variations be included within the scope of the invention that is defined by the following claims. The claims are intended to cover the indicated elements and steps in any arrangement or sequence that is effective to meet the objectives intended for the invention, unless the context specifically indicates the contrary.

What is claimed is:

1. A handheld electronic device, comprising:
a housing;
a light source assembly disposed in the housing, the light source including:
a substrate including an electrical circuit which provides the capability to cycle the light source on and off, the substrate having first and second major surfaces;
a light emitting diode light source located adjacent the first major surface of the substrate and connected to the electrical circuit; and
a heat spreader including a sheet of graphite, the heat spreader being in heat conducting association with the second major surface of the substrate wherein the light source can be cycled on and off within 10 seconds for at least two cycles without an appreciable rise in the maximum temperature from cycle to cycle.

2. The device of claim 1, wherein the sheet of graphite is selected from the group consisting of a sheet of compressed particles of exfoliated graphite and a graphitized polymer film.

3. The device of claim 2, wherein the sheet of compressed particles of exfoliated graphite has a thickness in a range of from about 0.1 to about 1.5 mm.

4. The device of claim 1, wherein:
the substrate is a flexible substrate; and
the heat spreader is a flexible heat spreader so as to aid in installation of the circuit assembly in the handheld electronic device.

5. The device of claim 1, further comprising:
a thermal via extending through the substrate into thermal engagement with the heat spreader, the LED being mounted upon the thermal via.

6. The device of claim 1, wherein the heat spreader is sized such that the light source can operate in a flash mode with a flash duration of at least about 250 ms with a recovery time of no greater than about 2 seconds, at ambient temperature of at least about 20° C., while maintaining a temperature at a junction between the LED and the substrate of no greater than about 135° C.

7. The device of claim 1, wherein:
the sheet of graphite has an in plane thermal conductivity of at least about 220 W/mK.

8. The device of claim 1, wherein:
the substrate comprises a flex circuit having a dielectric layer formed of a polymer material.

9. A handheld electronic device, comprising:
a housing;
a camera disposed in the housing; and
a light source assembly disposed in the housing adjacent the camera, the light source including:
a substrate;
a light emitting diode light source which is capable of cycling on and off mounted on one side of the substrate; and
a graphite heat spreader attached to an opposite side of the substrate, the graphite heat spreader having an in plane thermal conductivity substantially greater than a through plane thermal conductivity thereof.

10. The device of claim 9, wherein the substrate and the heat spreader are both flexible so as to aid in installation of the light source assembly in the device.

11. The device of claim 10, wherein:
the graphite heat spreader has a thickness in a range of from about 0.1 mm to about 1.5 mm.

12. The device of claim 9, wherein the in plane thermal conductivity of the graphite heat spreader is at least about 220 W/mK.

13. The device of claim 9, wherein the graphite heat spreader is sized such that the light source can operate in a flash mode with a flash duration of at least about 250 ms with a recovery time of no greater than about 2 seconds, at ambient temperature of at least about 20° C.

* * * * *